(12) United States Patent
Gopalakrishnan et al.

(10) Patent No.: US 12,074,590 B2
(45) Date of Patent: Aug. 27, 2024

(54) VEHICLE FUSE CONTROL IN KEY-OFF MODE

(71) Applicant: GM Global Technology Operations LLC, Detroit, MI (US)

(72) Inventors: Suresh Gopalakrishnan, Troy, MI (US); Chandra S. Namuduri, Troy, MI (US); Lyall Kenneth Winger, Waterloo (CA); James M. Morrison, Sebringville (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 160 days.

(21) Appl. No.: 17/731,911

(22) Filed: Apr. 28, 2022

(65) Prior Publication Data
US 2023/0353136 A1 Nov. 2, 2023

(51) Int. Cl.
*B60R 16/03* (2006.01)
*H03K 17/08* (2006.01)

(52) U.S. Cl.
CPC ............. *H03K 17/08* (2013.01); *B60R 16/03* (2013.01)

(58) Field of Classification Search
CPC .... H03K 17/08; H03K 17/12; H03K 17/0822; B60R 16/03; B60L 58/20; B60L 11/18
USPC ..................................................... 361/23, 187
See application file for complete search history.

(56) References Cited

U.S. PATENT DOCUMENTS

| | | | |
|---|---|---|---|
| 2014/0077592 A1* | 3/2014 | Koch ................. | B60L 3/04 307/29 |
| 2014/0183939 A1* | 7/2014 | Jiang ................. | B60L 1/08 429/231.1 |
| 2023/0234473 A1* | 7/2023 | Gannamaneni ....... | B60L 58/20 701/22 |

* cited by examiner

*Primary Examiner* — Danny Nguyen
(74) *Attorney, Agent, or Firm* — CANTOR COLBURN LLP

(57) ABSTRACT

A system in a vehicle includes a first fuse connected between a power source and a load. The first fuse is an electronic fuse (eFuse) to disconnect the load from the power source via the first fuse based on opening a first fuse switch. The system also includes a second fuse connected between the power source and the load via a second fuse switch. The first fuse and the second fuse are part of a cluster of fuses. A controller opens the first fuse switch and keeps the second fuse switch closed based on the vehicle entering a key-off mode in which the vehicle is turned off.

20 Claims, 4 Drawing Sheets

VEHICLE FUSE CONTROL IN KEY-OFF MODE

INTRODUCTION

The subject disclosure relates to vehicle fuse control in a key-off mode.

Vehicles (e.g., automobiles, trucks, construction equipment, farm equipment, automated factory equipment) include a number of systems that may be regarded as loads powered by the vehicle's battery. Generally, a battery distribution unit supplies power from the battery to electric centers of the vehicle. Each of the electric centers may further distribute the power to one or more loads. The battery distribution unit and electric centers include electronic fuses (eFuses) to disconnect a load from the battery based on the detection of a fault.

In a key-off mode, which refers to a mode in which the vehicle is not turned on or running, a low power state is eventually entered. Different loads reach the low power state at different times. The loads in the low power state may be referred to as vampire loads that drain the battery over time. When the vehicle remains in the key-off mode for a period of time (e.g., one or two weeks), these vampire loads may cause the battery to be unable to start the vehicle. The eFuses that provide protection against overcurrent, overvoltage, and the like are typically unhelpful in the low power state scenario. Accordingly, it is desirable to provide vehicle fuse control in a key-off mode.

SUMMARY

In one exemplary embodiment, a system in a vehicle includes a first fuse connected between a power source and a load. The first fuse is an electronic fuse (eFuse) to disconnect the load from the power source via the first fuse based on opening a first fuse switch. The system also includes a second fuse connected between the power source and the load via a second fuse switch. The first fuse and the second fuse are part of a cluster of fuses. A controller opens the first fuse switch and keeps the second fuse switch closed based on the vehicle entering a key-off mode in which the vehicle is turned off.

In addition to one or more of the features described herein, the system also includes a current sensor. The controller and the current sensor are part of an electric center that includes the first fuse and the second fuse.

In addition to one or more of the features described herein, the system also includes a third fuse that is part of the electric center. The third fuse is connected between the power source and a second load.

In addition to one or more of the features described herein, the current sensor includes a shunt resistor and an operational amplifier with programmable gain.

In addition to one or more of the features described herein, the controller adjusts the gain of the operational amplifier based on the vehicle entering the key-off mode.

In addition to one or more of the features described herein, the controller includes an analog to digital converter and a bias voltage of the analog to digital converter is adjusted based on the vehicle entering the key-off mode.

In addition to one or more of the features described herein, the system also includes a third fuse connected between the power source and a second load. The controller is part of the first fuse, the first fuse also includes a first current sensor, the second fuse includes a second controller and a second current sensor, and the third fuse includes a third controller and a third current sensor.

In addition to one or more of the features described herein, the second current sensor and the third current sensor include a shunt resistor and an operational amplifier with programmable gain.

In addition to one or more of the features described herein, the second controller adjusts the gain of the operational amplifier of the second current sensor and the third controller adjusts the gain of the operational amplifier of the third current sensor based on the vehicle entering the key-off mode.

In addition to one or more of the features described herein, the second controller and the third controller include an analog to digital converter, and a bias voltage of the analog to digital converter of the second controller and the third controller are adjusted based on the vehicle entering the key-off mode.

In another exemplary embodiment, a method of assembling a system in a vehicle includes controllably connecting a first fuse between a power source and a load. The first fuse is an electronic fuse (eFuse) to disconnect the load from the power source via the first fuse based on opening a first fuse switch. The method also includes controllably connecting a second fuse between the power source and the load via a second fuse switch, the first fuse and the second fuse being part of a cluster of fuses. The method further includes configuring a controller to open the first fuse switch and to keep the second fuse switch closed based on the vehicle entering a key-off mode in which the vehicle is turned off.

In addition to one or more of the features described herein, the method also includes disposing a current sensor in an electric center. The controller and the current sensor are part of the electric center that includes the first fuse and the second fuse.

In addition to one or more of the features described herein, the method also includes arranging a third fuse as part of the electric center. The arranging the third fuse includes connecting the third fuse between the power source and a second load.

In addition to one or more of the features described herein, the disposing the current sensor includes disposing the current sensor that includes a shunt resistor and an operational amplifier with programmable gain.

In addition to one or more of the features described herein, the configuring the controller includes the controller adjusting the gain of the operational amplifier based on the vehicle entering the key-off mode.

In addition to one or more of the features described herein, the configuring the controller includes assembling the controller to include an analog to digital converter with a bias voltage that is adjusted based on the vehicle entering the key-off mode.

In addition to one or more of the features described herein, the method also includes connecting a third fuse between the power source and a second load. The configuring the controller is as part of the first fuse. The method further includes including a first current sensor as part of the first fuse, including a second controller and a second current sensor as part of the second fuse, and including a third controller and a third current sensor as part of the third fuse.

In addition to one or more of the features described herein, the method also includes including a shunt resistor and an operational amplifier with programmable gain as part of the second current sensor and the third current sensor.

In addition to one or more of the features described herein, the method also includes configuring the second controller to adjust the gain of the operational amplifier of the second current sensor and configuring the third controller to adjust the gain of the operational amplifier of the third current sensor based on the vehicle entering the key-off mode.

In addition to one or more of the features described herein, the method also includes including an analog to digital converter as part of the second controller and the third controller, and adjusting a bias voltage of the analog to digital converter of the second controller and the third controller based on the vehicle entering the key-off mode.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
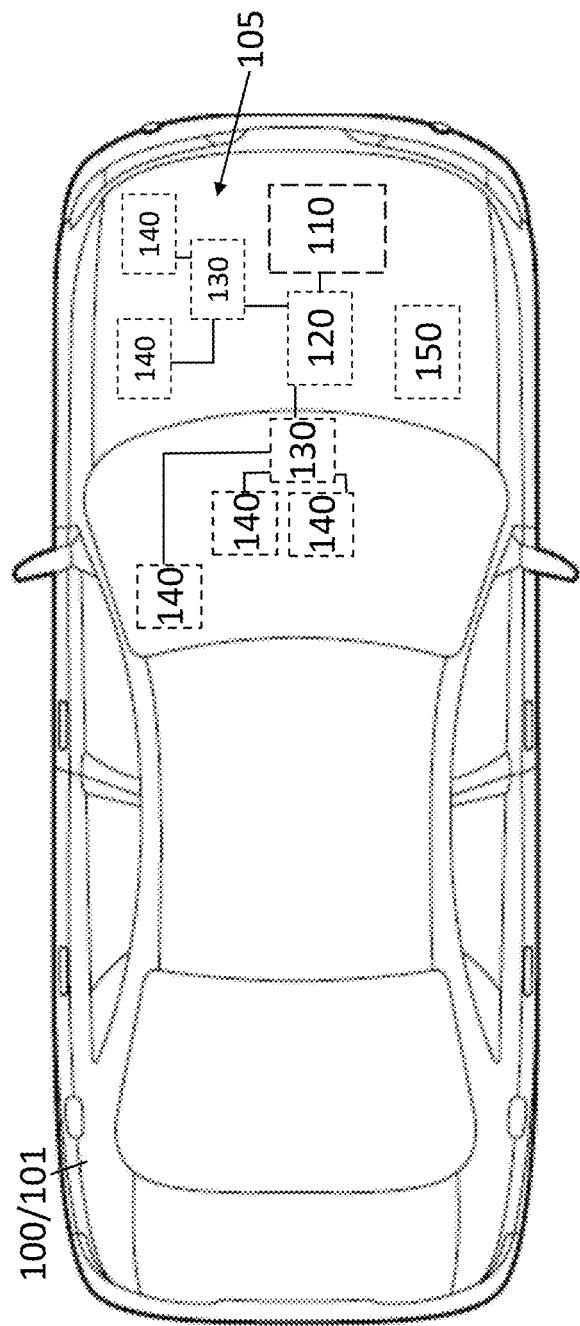
FIG. 1 is a block diagram of a vehicle that implements fuse control in a key-off mode according to one or more embodiments.

The following description is merely exemplary in nature and is not intended to limit the present disclosure, its application or uses. It should be understood that throughout the drawings, corresponding reference numerals indicate like or corresponding parts and features.

As previously noted, in a key-off mode (i.e., when the vehicle is turned off), some loads may still draw current while entering and even after entering a low power state. If the vehicle remains in the key-off mode, the battery may be drained by these loads. The fuses that protect the loads and battery are typically designed for another extreme, a maximum power draw and are, thus, unhelpful in assessing conditions during the lower power state. Embodiments of the systems and methods detailed herein relate to vehicle fuse control in a key-off mode. Specifically, eFuses implemented as integrated circuits are discussed and three specific control schemes are detailed for key-off mode operation. The eFuses and microcontrollers that control them may be referred to together as a smart electrical center (SEC), for example.

The first control scheme relates to a cluster of eFuses coupled to the same load. To increase efficiency and cost savings, identical hardware, including identical eFuses, may be used, with customization achieved via software. Because different vehicles have different loads and even the same vehicle may have different load sizes (e.g., one load has twice the full load current of another), power may be supplied to some loads through a cluster of two or more of the identical eFuses rather than a single one. In the key-off mode, all but one eFuse of a cluster may be turned off according to an exemplary embodiment.

By directing all the current to a load in the low power state through one eFuse, the current signal level is higher, as compared with power being supplied through two or more eFuses. This may increase the ability to measure current to the load in the low power state. That is, the signal-to-noise ratio (SNR) is increased because the noise is reduced proportional to the number of eFuses that contributed to the noise that are now turned off. The second and third control schemes may be applied within individual eFuses or at the microcontroller of an SEC. According to one exemplary embodiment, the internal reference voltage (i.e., the bias voltage) in the analog-to-digital converter (ADC) may be modified (e.g., decreased) in the key-off mode. According to another exemplary embodiment, the gain of the amplifier of the current sensor may be changed (e.g., increased) in the key-off mode.

In accordance with an exemplary embodiment, FIG. 1 is a block diagram of a vehicle 100 that implements fuse control in a key-off mode. A vehicle controller 150 is shown. The vehicle controller 150 may control vehicle operations, provide alerts, and the like. Aspects of an exemplary power distribution system 105 are also shown. A battery 110 is coupled to a battery distribution unit 120. The battery distribution unit 120 is shown coupled to two SECs 130. Each of the SECs 130 may be coupled to one or more loads 140. As shown in FIG. 1, one of the SECs 130 is coupled to two loads 140 while the other SEC 130 is coupled to three loads 140. As further discussed with reference to FIG. 2, each of the SECs 130 may include one or more eFuses 210 coupled to each of the loads 140. While control of eFuses is discussed with specific reference to the exemplary SECs 130, any eFuses 210 (e.g., in the battery distribution unit 120, in a power distribution system 105 with a different architecture, outside the vehicle application) may benefit from one or more embodiments of the control schemes detailed herein.

Figure 2:
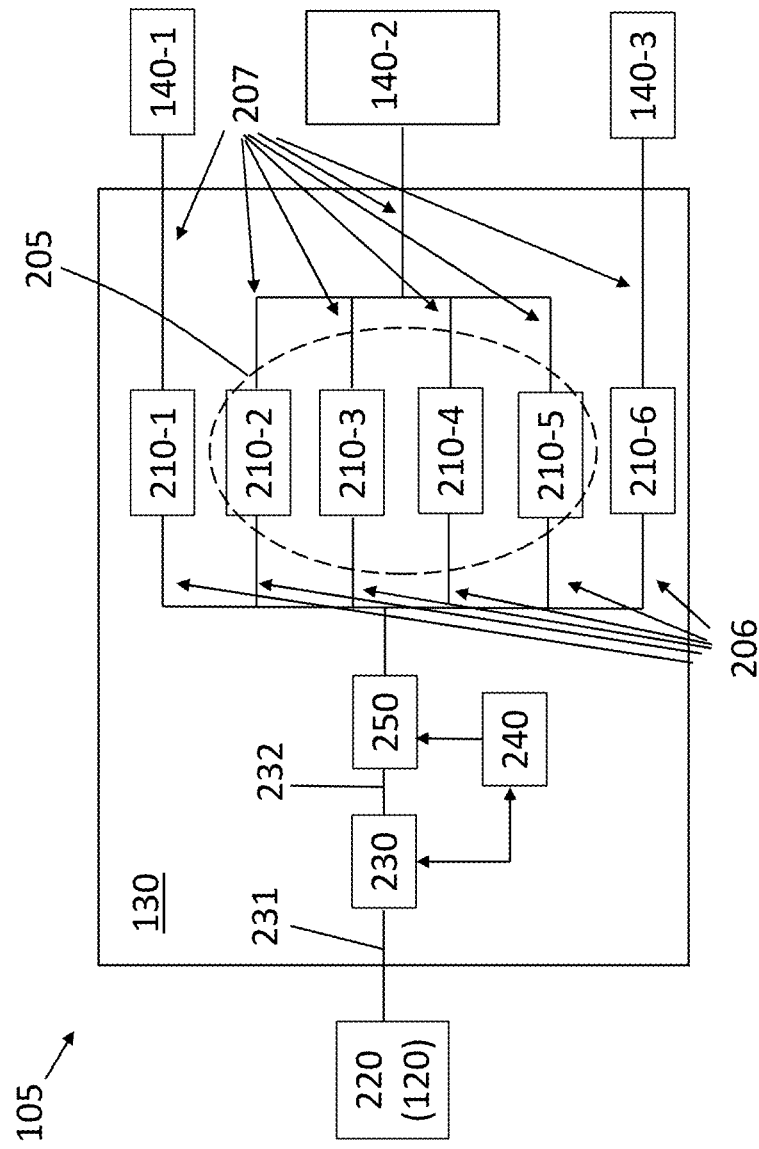
FIG. 2 is a block diagram detailing aspects of a smart electric center in which fuse control is implemented in a key-off mode according to one or more embodiments.

FIG. 2 is a block diagram detailing aspects of an SEC 130 in which fuse control is implemented in a key-off mode according to one or more embodiments. The exemplary SEC 130 is shown to include eFuses 210-1 through 210-6 (generally referred to as 210) coupled to loads 140-1, 140-2, and 140-3 (generally referred to as 140). The eFuses 210-2, 210-3, 210-4, and 210-5 are indicated as being part of a cluster 205. That is, the eFuses 210-2, 210-3, 210-4, and 210-5 of the cluster 205 are coupled to the same load 140-2, while the eFuses 210-1 and 210-6 are respectively coupled to single loads 140-1 and 140-3. The exemplary arrangement is used for explanatory purposes and is not intended to be limiting. Any number of eFuses 210, clusters 205, and loads 140 may be present according to alternate embodiments.

As shown, each of the eFuses 210 includes a fuse power input line 206 that couples the eFuses 210 to a power source 220. The power source 220 may be via the battery distribution unit 120 of the power distribution system 105, for example. In alternate applications and arrangements, the power source 220 may be the battery 110 or another distribution level. As also shown, each of the eFuses 210 includes a fuse power output line 207 that couples the eFuses 210 to loads 140. In the case of eFuses 210-2, 210-3, 210-4, and 210-5, which are part of the cluster 205, all of the eFuses 210 of the cluster 205 are coupled to the same load 140-2.

The SEC 130 is also shown to include an SEC current sensor 230, an SEC controller 240, and an SEC switch 250. The SEC power input line 231 to the SEC 130 and to the current sensor 230 is indicated. At the output of the current sensor 230, this SEC power input line 231 is indicated as SEC current 232 for explanatory purposes. As detailed with reference to FIG. 3, the SEC controller 240 may shut down all but one eFuse 210 of the cluster 205 in a key-off mode according to one exemplary control scheme. As detailed with reference to FIG. 4, the current sensor 230 or an ADC 430 of the SEC controller 240 may be modified alternately or additionally according to other exemplary control schemes.

Figure 3:
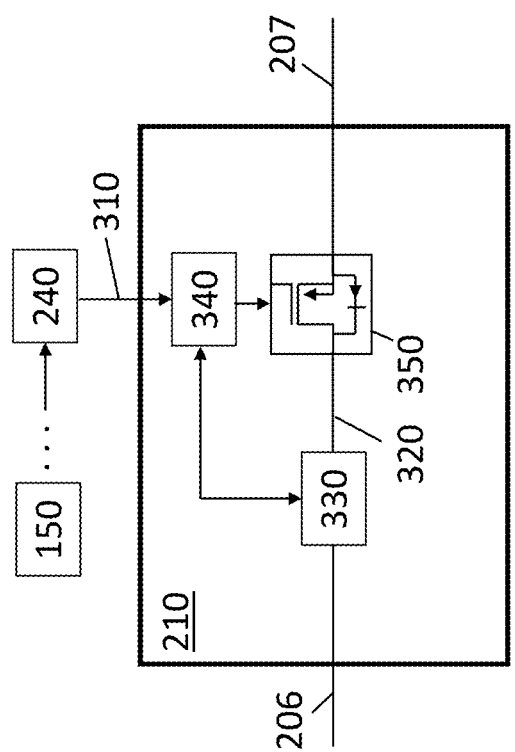
FIG. 3 is a block diagram detailing aspects of an electronic fuse (eFuse) that is controlled in a key-off mode according to one or more embodiments.

FIG. 3 is a block diagram detailing aspects of an eFuse 210 that is controlled in a key-off mode according to one or more embodiments. The eFuse 210 may be part of a cluster 205, for example. The fuse power input line 206 into the eFuse 210 and the fuse power output line 207 out of the eFuse 210 (e.g., to a load 140) are shown. The fuse power input line 206 to the eFuse 210 is input to a current sensor 330 of the eFuse 210, as shown. At the output of the current sensor 330, this fuse power input line 206 is indicated as fuse current 320 for explanatory purposes.

The fuse current sensor 330 senses the current flowing in through the fuse power input line 206 and provides an indication to the fuse controller 340. The vehicle controller 150, SEC controller 240, and fuse controller 340 of each eFuse 210 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

As shown in FIG. 3, the fuse controller 340 may obtain a control signal 310 from the SEC controller 240 in addition to information from the fuse current sensor 330. Based on either the control signal 310 or the current indication from the fuse current sensor 330, the fuse controller 340 may control a fuse switch 350. The fuse switch 350 may be a solid state switch, shown implemented as a field effect transistor (FET), for example. When the fuse controller 340 controls the fuse switch 350 to open, the flow of fuse current 320 out of the eFuse 210 on the fuse power output line 207 is interrupted.

According to one of the exemplary control schemes, when the vehicle 100 enters key-off mode, the fuse controller 340 provides the control signal 310 to all but one of the eFuses 210 of a cluster 205. This control signal 310 may be prompted by an indication from the vehicle controller 150 that the vehicle 100 has entered a key-off mode. As indicated, the SEC controller 240 may obtain the information about the mode of the vehicle 100 directly or indirectly (e.g., via one or more additional controllers) from the vehicle controller 150. Based on the control signal 310, only one eFuse 210 of a cluster 205 continues to operate in the key-off mode. The selection of which eFuse 210 of the cluster 205 continues to operate (i.e., which eFuse 210 of the cluster 205 is not provided with the control signal 310) may be predefined, for example. According to alternate embodiments, two or more of the eFuses 210 of the cluster 205 may remain enabled in the key-off mode.

As a result of opening the fuse switches 250 for all but one eFuse 210 of the cluster 205 (or a subset of the total eFuses 210 of the cluster 205), the total flow of power to the corresponding load 140 (e.g., load 140-2 supplied by the cluster 205 in FIG. 2) is channeled through fewer eFuses 210. As previously noted, this increases the SNR of the current signal and facilitates more accurate assessment of conditions during the lower power state (i.e., key-off mode). The increase in SNR is proportional to the number of eFuses 210 of the cluster 205 whose fuse switches 350 are opened based on the control signal 310. As discussed with reference to FIG. 4, one or more other types of fuse control may additionally or alternately be implemented.

Figure 4:
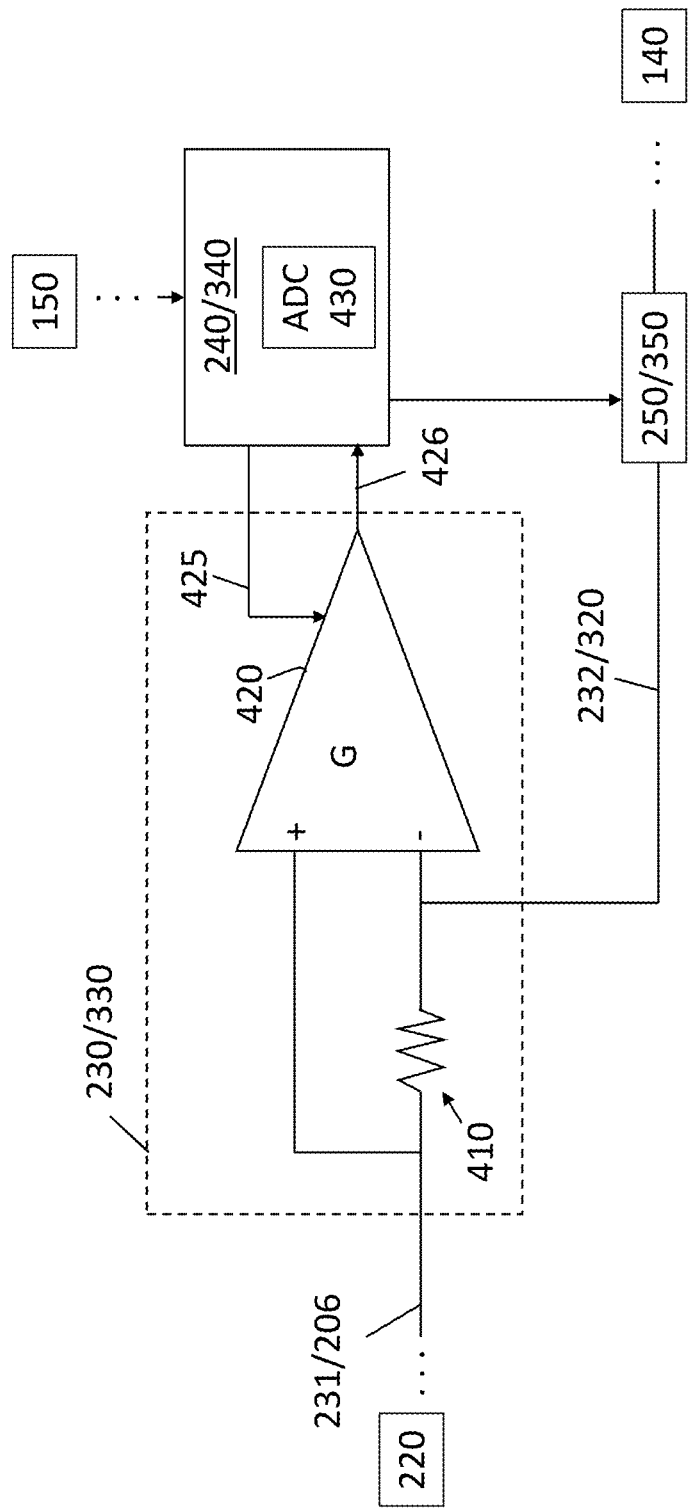
FIG. 4. is a block diagram detailing aspects of a current sensor and controller used to implement fuse control in a key-off mode according to one or more embodiments.

FIG. 4. is a block diagram detailing aspects of a current sensor 230, 330 and controller 240, 340 used to implement fuse control in a key-off mode according to one or more embodiments. As indicated, relevant aspects of the SEC current sensor 230 or fuse current sensor 330 are shown along with an ADC 430 of the SEC controller 240 or fuse controller 340. That is, the second and third control schemes may be performed at the level of each SEC 130 and/or each eFuse 210. The controller 240, 340 is shown connected directly or indirectly to the vehicle controller 150, which provides an indication when the vehicle 100 enters the key-off mode.

The current sensor 230, 330 includes a shunt resistor 410 and an operational amplifier 420 with a programmable gain G. The current sensor 230, 330 provides a current value 426 to the corresponding controller 240, 340. When the vehicle controller 150 indicates to the controller 240, 340 that the vehicle 100 has entered the key-off mode, the controller 240, 340 may adjust the gain G of the operational amplifier 420 of the corresponding current sensor 230, 330 according to an exemplary embodiment. Specifically, when the vehicle 100 enters the key-off mode, the controller 240, 340 may increase the gain G to increase the resolution of the current sensor 230, 330 in the low power state. The gain G may be set to a predefined, higher value. This represents a fuse control scheme that may be implemented alone (at the level of the SEC 130 and/or at the level of each eFuse 210) or in combination with one of the other key-off mode fuse control schemes.

According to another exemplary embodiment, the ADC 430 of the SEC controller 240 and/or the ADC 430 of the fuse controller 340 may be controlled when the vehicle controller 150 indicates that the vehicle 100 has entered the key-off mode. Specifically, the bias voltage used as a reference in the ADC 430 may be adjusted. More specifically, the bias voltage may be decreased when the controller 240, 340 obtains an indication, via the vehicle controller 150, that the vehicle 100 has entered the key-off mode. The bias voltage may be decreased to a predefined, lower value.

While fuse control based on the vehicle 100 entering the key-off mode is discussed in particular, each of the control schemes may be implemented in reverse as soon as the vehicle 100 enters the key-on mode. That is, when the vehicle controller 150 indicates that the vehicle 100 has entered the key-on mode, all of the eFuses 210 of all clusters 205 may be activated (i.e., the fuse switch 250 of each eFuse 210 is closed). Additionally or alternatively, the gain G of the operational amplifier 420 of the SEC current sensor 230 and/or the fuse current sensor 330 in each eFuse 210 may be decreased to a predefined nominal value. Additionally or alternatively, the bias voltage of the ADC 430 of the SEC controller 240 and/or fuse controller 340 in each eFuse 210 may be increased to a predefined nominal value. While the vehicle controller 150 may typically indicate a key-on mode, a given eFuse 210 may detect an increase in power draw from an associated load 140 while still in key-off mode. In this case, the given eFuse 210 may trigger the switch to key-on mode.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A system in a vehicle comprising:
a first fuse connected between a power source and a load, wherein the first fuse is an electronic fuse (eFuse) configured to disconnect the load from the power source via the first fuse based on opening a first fuse switch;
a second fuse connected between the same power source and the load via a second fuse switch, the first fuse and the second fuse being part of a cluster of fuses, wherein the first fuse and the second fuse are closed during a key-on mode to supply power from the same power source to the load; and
a controller configured to open the first fuse switch and to keep the second fuse switch closed based on the vehicle entering a key-off mode in which the vehicle is turned off, the second fuse switch kept closed to continue to supply power to the load from the same power source.

2. A system in a vehicle, comprising:
a first fuse connected between a power source and a load, wherein the first fuse is an electronic fuse (eFuse) configured to disconnect the load from the power source via the first fuse based on opening a first fuse switch;
a second fuse connected between the power source and the load via a second fuse switch, the first fuse and the second fuse being part of a cluster of fuses;
a controller configured to open the first fuse switch and to keep the second fuse switch closed based on the vehicle entering a key-off mode in which the vehicle is turned off; and
a current sensor, wherein the controller and the current sensor are part of an electric center that includes the first fuse and the second fuse, the controller configured to, based on the vehicle being in the key-off mode, perform at least one of:
adjusting a gain of an operational amplifier of the current sensor; and
adjusting a bias voltage of an analog to digital converter of the controller.

3. The system according to claim 1, further comprising a current sensor, wherein the controller and the current sensor are part of an electric center that includes the first fuse and the second fuse, and further comprising a third fuse that is part of the electric center, wherein the third fuse is connected between the same power source and a second load.

4. The system according to claim 3, wherein the current sensor includes a shunt resistor and an operational amplifier with programmable gain.

5. The system according to claim 4, wherein the controller is configured to adjust the gain of the operational amplifier based on the vehicle entering the key-off mode.

6. The system according to claim 3, wherein the controller includes an analog to digital converter and a bias voltage of the analog to digital converter is configured to be adjusted based on the vehicle entering the key-off mode.

7. The system according to claim 1, further comprising a third fuse connected between the same power source and a second load, wherein the controller is part of the first fuse, the first fuse also includes a first current sensor, the second fuse includes a second controller and a second current sensor, and the third fuse includes a third controller and a third current sensor.

8. The system according to claim 7, wherein the second current sensor and the third current sensor include a shunt resistor and an operational amplifier with programmable gain.

9. The system according to claim 8, wherein the second controller is configured to adjust the gain of the operational amplifier of the second current sensor and the third controller is configured to adjust the gain of the operational amplifier of the third current sensor based on the vehicle entering the key-off mode.

10. The system according to claim 7, wherein the second controller and the third controller include an analog to digital converter, and a bias voltage of the analog to digital converter of the second controller and the third controller are configured to be adjusted based on the vehicle entering the key-off mode.

11. A method of assembling a system in a vehicle, the method comprising:
controllably connecting a first fuse between a power source and a load, wherein the first fuse is an electronic fuse (eFuse) configured to disconnect the load from the power source via the first fuse based on opening a first fuse switch;
controllably connecting a second fuse between the same power source and the load via a second fuse switch, the first fuse and the second fuse being part of a cluster of fuses, and configuring the first fuse and the second fuse to be closed during a key-on mode to supply power from the same power source to the load; and
configuring a controller to open the first fuse switch and to keep the second fuse switch closed based on the vehicle entering a key-off mode in which the vehicle is turned off, the controller configured to keep the second fuse switch closed to continue to supply power to the load from the same power source.

12. The method according to claim 11, further comprising disposing a current sensor in an electric center, wherein the controller and the current sensor are part of the electric center that includes the first fuse and the second fuse.

13. The method according to claim 12, further comprising arranging a third fuse as part of the electric center, wherein the arranging the third fuse includes connecting the third fuse between the same power source and a second load.

14. The method according to claim 13, wherein the disposing the current sensor includes disposing the current sensor that includes a shunt resistor and an operational amplifier with programmable gain.

15. The method according to claim 14, wherein the configuring the controller includes the controller adjusting the gain of the operational amplifier based on the vehicle entering the key-off mode.

16. The method according to claim 13, wherein the configuring the controller includes assembling the controller to include an analog to digital converter with a bias voltage that is configured to be adjusted based on the vehicle entering the key-off mode.

17. The method according to claim 11, further comprising connecting a third fuse between the same power source and a second load, wherein the configuring the controller is as part of the first fuse, including a first current sensor as part of the first fuse, including a second controller and a second current sensor as part of the second fuse, and including a third controller and a third current sensor as part of the third fuse.

18. The method according to claim 17, further comprising including a shunt resistor and an operational amplifier with programmable gain as part of the second current sensor and the third current sensor.

19. The method according to claim 18, further comprising configuring the second controller to adjust the gain of the operational amplifier of the second current sensor and configuring the third controller to adjust the gain of the operational amplifier of the third current sensor based on the vehicle entering the key-off mode.

20. The method according to claim 17, further comprising including an analog to digital converter as part of the second controller and the third controller, and adjusting a bias voltage of the analog to digital converter of the second controller and the third controller based on the vehicle entering the key-off mode.

* * * * *